United States Patent [19]

Ogata

[11] Patent Number: 4,845,055
[45] Date of Patent: Jul. 4, 1989

[54] RAPID ANNEALING UNDER HIGH PRESSURE FOR USE IN FABRICATION OF SEMICONDUCTOR DEVICE

[75] Inventor: Takashi Ogata, Shizuoka, Japan

[73] Assignee: Yamaha Corporation, Hamamatsu, Japan

[21] Appl. No.: 194,962

[22] Filed: May 7, 1988

[30] Foreign Application Priority Data

May 21, 1987 [JP] Japan .................. 62-124897

[51] Int. Cl.$^4$ .................. H01L 21/324
[52] U.S. Cl. .................. 437/247; 148/DIG. 4
[58] Field of Search .................. 437/247; 148/DIG. 4

[56] References Cited

U.S. PATENT DOCUMENTS

| | | | |
|---|---|---|---|
| 4,566,913 | 1/1986 | Brodsky et al. | 148/DIG. 4 |
| 4,567,058 | 1/1986 | Koh | 156/643 |
| 4,752,592 | 6/1988 | Tamura et al. | 437/247 |

OTHER PUBLICATIONS

Ho et al., "Characterization of Rapidly Annealed MO-Polycide", J. Vac. Sci. Technol. A3(3) (May/Jun. 1985), pp. 896-899.

*Primary Examiner*—Olik Chaudhuri
*Attorney, Agent, or Firm*—Burns, Doane, Swecker & Mathis

[57] ABSTRACT

For preventing a semiconductor substrate from a heat attack, a method of rapid annealing using a lamp unit for a heat radiation comprises the step of preparing a semiconductor substrate having a multiple-layer structure and a vessel having an annealing chamber where the lamp unit is placed, the vessel is associated with an inert gas supplying system operative to supply a high-pressure inert gas to the annealing chamber, and the above step is followed by the steps of placing the semiconductor substrate in the annealing chamber, supplying the high-pressure inert gas to the annealing chamber so as to create a high-pressure inert ambient within a predetermined range and activating the lamp unit for the heat radiation so as to heat up the semiconductor substrate, so that the heat radiation is decreased in intensity by virtue of the high-pressure inert ambient.

6 Claims, 4 Drawing Sheets

RAPID ANNEALING UNDER HIGH PRESSURE FOR USE IN FABRICATION OF SEMICONDUCTOR DEVICE

FIELD OF THE INVENTION

This invention relates to a rapid annealing used in a fabrication process of a semiconductor device and, more particularly, to an inert ambient for low temperature annealing.

BACKGROUND OF THE INVENTION

In a general fabrication process of a semiconductor device, annealing techniques are frequently used for activation of impurity atoms, healing of crystal damages and so on. In a conventional furnace annealing, semiconductor substrates are placed in a high temperature ambient created in an electric furnace for a relatively long time period, and the high temperature ambient is liable to influence impurity profiles which are formed in the semiconductor substrates. This sometimes results in undesirable deviation from the designed characteristics, and, for this reason, a lot of rapid annealing techniques are proposed for minimization of the influence due to the heat-treatment.

One of the rapid annealing techniques is well known in the art as a lamp annealing in which a semiconductor substrate is placed in an inert ambient of the atmospheric pressure created in an annealing chamber and treated with a heat radiated from lamps provided in the chamber. The time period is reduced to be about 1/180 with respect to the conventional furnace annealing.

However, a problem is encountered in high-temperature ambient. Namely, the semiconductor substrate is heated about 1000 degrees in centigrade in the annealing chamber, and, for this reason, refractory metal layers or the silicide layers thereof formed on the semiconductor substrate are subjected to mechanical stresses due to shrinkages in volume. The high-temperature ambient further results in insufficient suppression of the driftage of the impurity atom profiles even if the time period is reduced in comparison with the furnace annealing. These problems deteriorates the production yield and the reliability of the semiconductor device, so that a low-temperature annealing method has been sought for improvement of semiconductor manufacturing.

SUMMARY OF THE INVENTION

It is therefore an important object of the present invention to provide a method of rapid annealing in which a semiconductor substrate is heated up to a relatively low temperature with a sufficient annealing result.

To accomplish these objects, the present invention proposes to anneal in an high-pressure inert ambient.

In accordance with the present invention, there is provided a method of rapid annealing using a lamp unit for a heat radiation, comprising the steps of (a) preparing a semiconductor substrate having a multiple-layer structure and a vessel having an annealing chamber where the lamp unit is placed, the vessel being associated with an inert gas supplying system operative to supply a high-pressure inert gas to the annealing chamber, (b) placing the semiconductor substrate in the annealing chamber, (c) supplying the high-pressure inert gas to the annealing chamber so as to create a high-pressure inert ambient within a predetermined pressure range and (d) activating the lamp unit for the heat radiation so as to heat up the semiconductor substrate.

The high pressure inert ambient may range between about 2 atms and about 15 atms, and the high-pressure inert gas may be selected from the group consisting of nitrogen and argon. In order to rapidly heat up the semiconductor substrate, the lamp unit may radiate infrared rays.

BRIEF DESCRIPTION OF THE DRAWINGS

The features and advantages of a method of rapid annealing according to the present invention will be more clearly understood from the following description taken in conjunction with the accompanying drawings in which.

DESCRIPTION OF THE PREFERRED EMBODIMENTS

Figure 1:
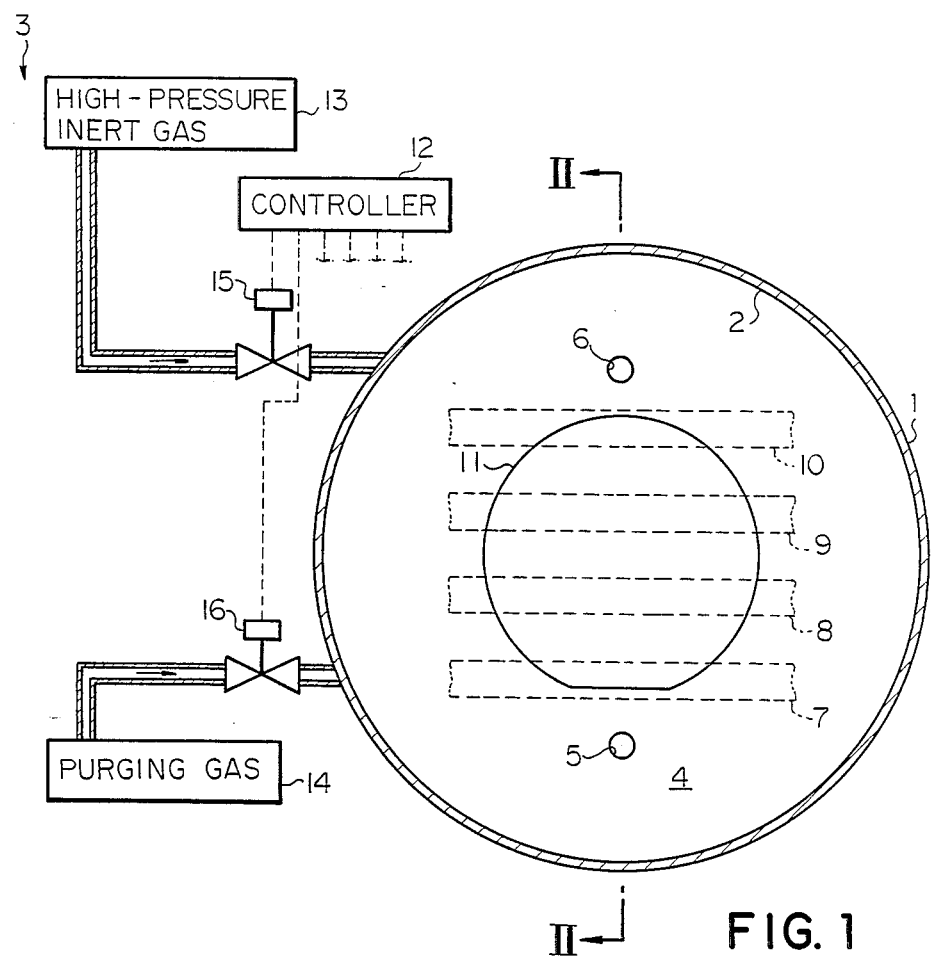
FIG. 1 is a cross sectional view showing a lamp annealing apparatus used for a rapid annealing method according to the present invention.
Figure 2:
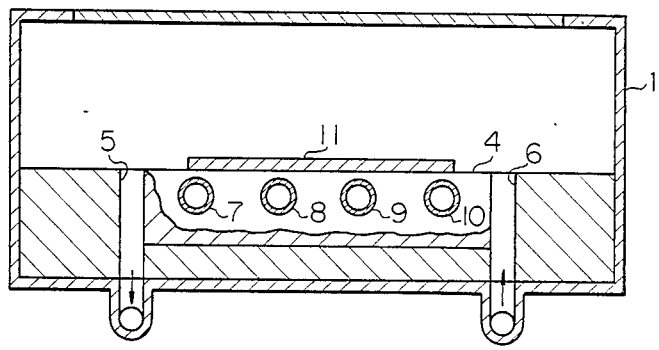
FIG. 2 is a fragmentary cross sectional view taken along the line II—II of FIG. 1 and showing the lamp annealing apparatus.

Referring first to FIGS. 1 and 2 of the drawings, there is shown a lamp annealing apparatus used in a method of rapid annealing according to the present invention. The annealing apparatus largely comprises a vessel 1 with a lid defining an annealing chamber 2 and an inert gas supplying system 3 provided in association with the vessel 1. The vessel 1 has a wafer retainer 4 formed with a plurality of openings two of which are designated by reference numerals 5 and 6 and a plurality of halogen-lamp tubes 7, 8, 9 and 10 provided under a central zone of the wafer retainer 4 where a semiconductor substrate 11 with a multiply-layer structure is placed. The plural openings including the opening 5 are coupled to a vacuum system ( not shown ) through a valve unit ( not shown ) so that the annealing chamber can be evacuated by the vacuum system. On the other hand, the plural openings including the opening 6 are connected to the inert gas supplying system 3 through valve units ( not shown ) so that the inert gas supplying system 3 can supply an inert gas or a inert gaseous mixture to the annealing chamber 2 through the openings. Though not shown in the drawings, the halogen-lamp tubes 7 to 10 are coupled to an electric power source and activated to radiate infrared rays by a controller 12.

The inert gas supplying system 3 has two reservoir vessels 13 and 14 the former of which storages a high-pressure inert gas and the latter of which storages a purging gas of a relatively low pressure. In this instance, both of the high-pressure inert gas and the low-pressure purging gas are of nitrogen, however another inert gas such as, for example, argon or a gaseous mixture containing the inert gas or gases may be available. The reservoir vessels 13 and 14 are coupled to control valves 15 and 16 which in turn are coupled to the openings including the opening 6 through the valve units ( not shown). The control valves 15 and 16 have respective electric driving units electrically coupled to the controller 12, so that the the purging gas or the high-pressure inert gas is supplied from the reservoir vessel 13 or 14 to the annealing chamber 2 under the control of the controller 12.

Figure 3:
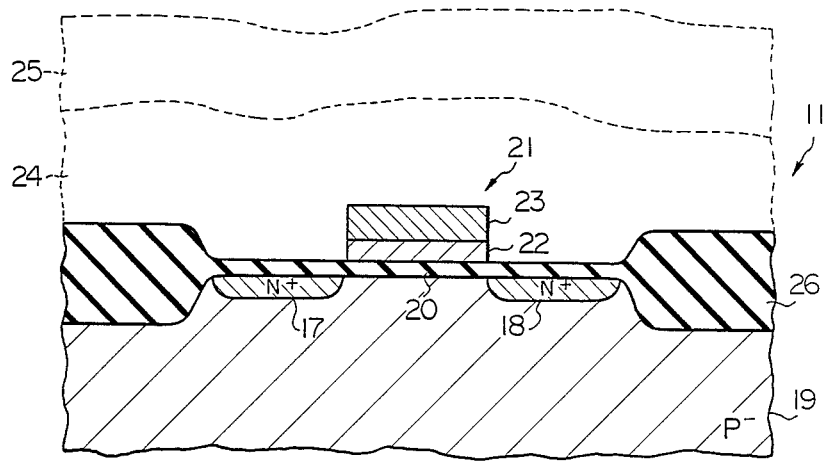
FIG. 3 is a cross sectional view showing the structure of a MOS field effect transistor fabricated on the semiconductor substrate placed in the lamp annealing apparatus illustrated in FIGS. 1 and 2.

Turning to FIG. 3 of the drawings, the multiple-layer structure of the semiconductor substrate 11 is illustrated and provides a MOS-type field effect transistor. The MOS-type field effect transistor forms part of an integrated circuit together with a plurality of circuit component elements formed on the same semiconductor substrate 11. The MOS-type field effect transistor comprises heavily-doped n-type source and drain regions 17 and 18 formed in a lightly-doped p-type single crystal silicon layer 17, a gate insulating film 20 formed on that area between the source and drain regions 17 and 18, and a gate structure 21 having a polysilicon film 22 overlain by a refractory metal film 23. The MOS-type field effect transistor is covered with an insulating film 24 and electrically connected to one of the circuit component elements through an interconnection (not shown), and the entire structure of the integrated circuit in turn is covered with a passivation film 25 of phosphosilicate glass (PSG).

The multiple-layer structure illustrated in FIG. 3 is obtained by the following steps. The starting material is the lightly-doped p-type single crystal silicon layer or substrate 19. A field oxide film 26 is formed in the lightly-doped silicon layer 19 by a localized oxidation of silicon, and, then, the lightly-doped p-type silicon layer 19 is placed in an oxidation ambient. A silicon dioxide film is thermally grown on the surface portion of the lightly-doped p-type silicon layer 19, and boron atoms are implanted through the silicon dioxide film for adjustment of the threshold voltage of the MOS-type field effect transistor. The silicon dioxide film is removed to expose a fresh surface of the silicon layer 19, and a silicon dioxide film serving as the gate insulating film 20 is thermally grown on the fresh surface again.

Subsequently, polysilicon is deposited on the silicon dioxide film by using a chemical vapor deposition (CVD) technique, and the polysilicon film is doped with phosphorus atoms by an ion implantation technique. After removing a phosphosilicate glass film produced during the ion implantation, tungsten-silicide is deposited on the polysilicon film by using a sputtering technique, and, then, the tungsten-silicide film and the polysilicon film are etched and patterned by using appropriate lithographic techniques to form the gate structure 21 over that area between the source and drain regions 17 and 18. Phosphorus atoms are implanted into the surface portion of the lightly-doped p-type silicon layer 19 using the gate structure 21 as a mask, so that the source and drain regions 17 and 18 are formed under those areas outside the gate structure 21 in a self-aligned manner. For activation of the implanted impurity atoms and healing of the crystal damages produced during the ion implantation, the multiple-layer structure is placed in the annealing chamber 2 of the lamp annealing apparatus, and an annealing is carried out in a manner described hereinbefore. The formation of the insulating film 24, the aluminum metallization and formation of the passivation film 25 are successively carried out, however no further description is incorporated because they are well known in the art.

In the annealing process, the semiconductor substrate 11 is placed on the wafer retainer 4 in the annealing chamber 2 through the open lid, and, then, the lid is closed to seal up the annealing chamber 2. The vacuum system is actuated to evacuate the annealing chamber 2, and the purging gas is supplied to the annealing chamber 2, thereby producing an inert ambient. Subsequently, the high-pressure inert gas is led to the annealing chamber 2 through the valve units which is controlled by the controller 12, so that a high-pressure inert ambient is produced in the annealing chamber 2. The high-pressure inert ambient has a pressure ranging between about 2 atms and about 15 atms. This is because of the fact that a negligible amount of mechanical stress takes place in the semiconductor substrate 11 in a high-pressure inert ambient below about 15 atms. Moreover, if the high-pressure inert ambient has a pressure lower than about 2 atms, no substantial difference in annealing temperature is observed in the inert ambient so as to produce the annealing effects similar to one another. However, the high-pressure inert ambient ranging between 5 atms to 10 atms is desirable to obtain an eminent annealing effect.

After pressurization of the annealing chamber 2, the controller 12 activates the halogen-lamp tubes 7 to 10, so that the halogen-lamp tubes 7 to 10 radiate infrared rays to heat up the semiconductor substrate 11 to a certain temperature between about 600 degrees in centigrade and about 1000 degrees in centigrade. The inert ambient maintains the certain temperature for a time period ranging between about several seconds and about 100 seconds. After a certain cooling time period, the high-pressure inert gas is evacuated from the annealing chamber 2, and the annealing chamber 2 is purged with the purging gas again. Then, the semiconductor substrate 11 is taken out from the annealing chamber 2. In this instance, the annealing process is controlled by the controller 12, but it is possible to manually control the annealing process.

Figure 4:
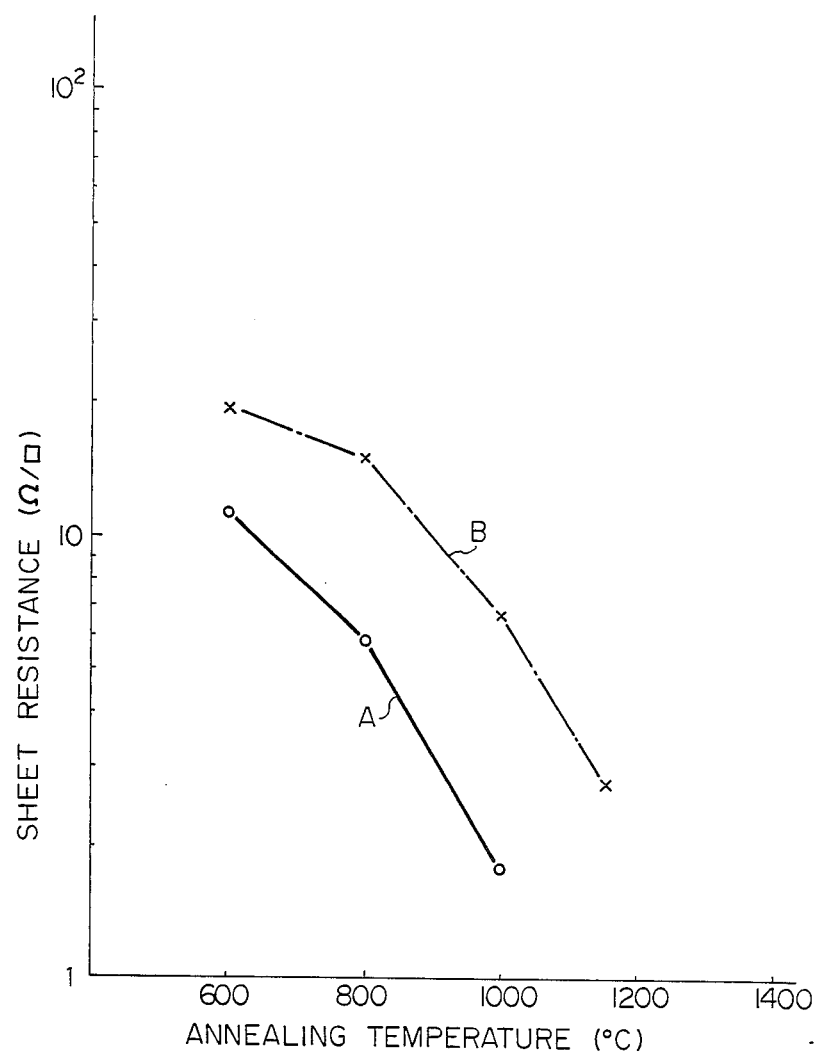
FIG. 4 is a graph showing sheet resistances of silicide layers in terms of annealing temperatures.

The semiconductor substrates thus annealed in the high-pressure inert ambient of about 10 atms in various annealing temperatures are measured for sheet resistances of the respective silicide layers 23. The results are plotted as plots A in FIG. 4 in comparison with measured results, (which are plotted as plots B), of the semiconductor substrates with the corresponding gate structures annealed in the conventional manner, i.e., in the inert ambient of the atmospheric pressure created in the lamp annealing chamber. The annealings according to the present invention are approximately equal in time period to the annealings carried out in the inert ambient of the atmospheric pressure. Comparing plots A with plots B, it will be understood that the high-pressure inert ambient is decreased in temperature by about 250 degrees in centigrade in comparison with the inert ambient of the conventional atmospheric pressure. Thus, the annealing method according to the present invention is advantageous over the conventional annealing technique in annealing temperature, which results in increasing of the production yield and in reliability.

Figure 5:
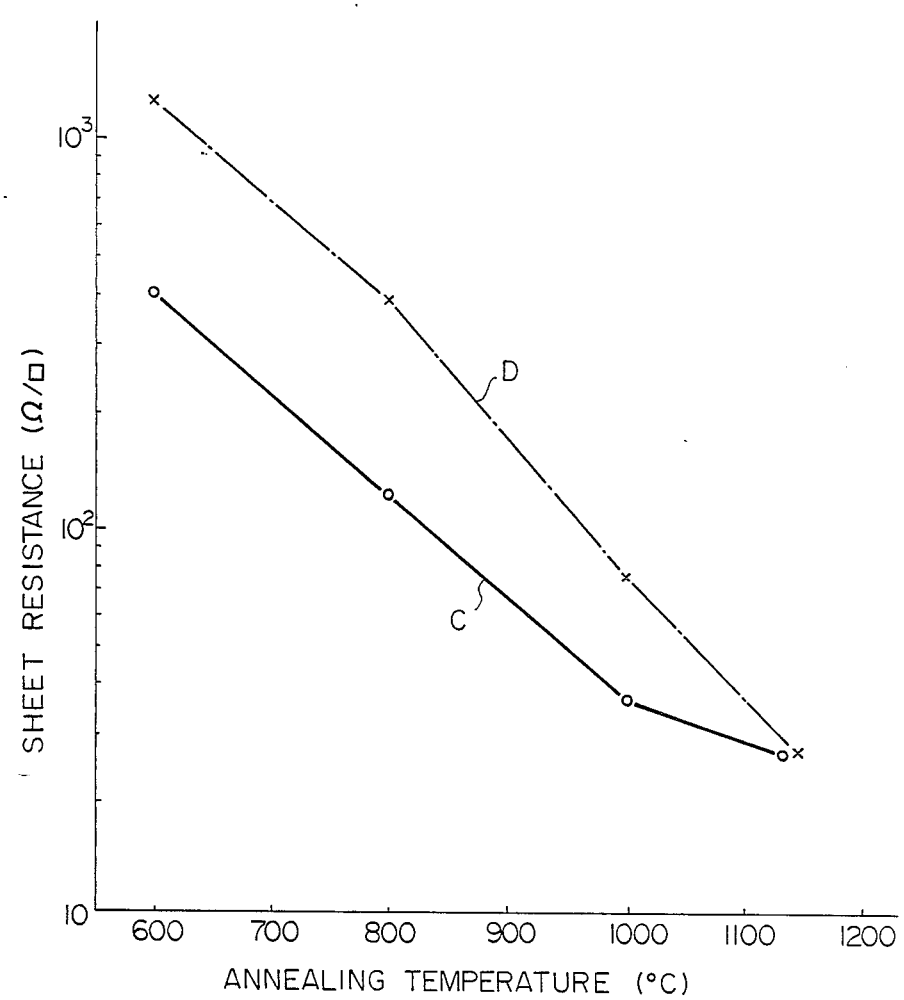
FIG. 5 is a graph showing sheet resistances of boron-implanted regions in terms of annealing temperatures.

FIG. 5 shows another experimental result carried out for sheet resistances of boron-implanted regions such as, for example, source and drain regions of p-channel MOS type field effect transistors. Plots C shows resistances of the boron-implanted regions in terms of various annealing temperatures after annealing in the high-pressure inert ambient of about 10 atms for about 10 seconds, and, on the other hand, plots D shows resistances of the boron-implanted regions in terms of corresponding annealing temperature after annealing in the inert ambient of the atmospheric pressure for about 10 seconds. According to this experiment, the annealing temperature of the present invention is lower than the conventional annealing by about 100 degrees in centigrade so as to obtain the sheet resistances of about 100 ohms/□, so that the driftages in impurity profile are smaller than the implanted regions annealed in the inert ambient of the atmospheric pressure.

In the experiments described above, the method of rapid annealing according to the present invention is advantageous over the conventional lamp annealing in lowering in annealing temperature by virtue of the high-pressure inert ambient. Moreover, the annealing temperature can be decreased by a temperature more than 300 degrees in centigrade under a different inert ambient produced by selection of a different kind of inert gas, pressure and the amount of flowing gas. Additionally, the annealing method of the present invention is applicable for reflow process of phosphosilicate glass PSG or boron-phosphosilicate glass ( BPSG ) and baking processes.

Although particular embodiment of the present invention have been shown and described, it will be obvious to those skilled in the art that various changes and modifications may be made without departing from the spirit and scope of the present invention.

What is claimed is:

1. A method of rapid annealing using a lamp unit for a heat radiation, comprising the steps of:
    (a) preparing a semiconductor substrate having a multiple-layer structure and a vessel having an annealing chamber where said lamp unit is placed, said vessel being associated with an inert gas supplying system operative to supply a high-pressure inert gas to said annealing chamber;
    (b) placing said semiconductor substrate in said annealing chamber;
    (c) supplying said high-pressure inert gas to said annealing chamber so as to create a high-pressure inert ambient within a predetermined pressure range; and
    (d) activating said lamp unit for said heat radiation so as to heat said semiconductor substrate, wherein said high pressure inert ambient ranges from about 2 atms to about 15 atms.

2. A method of rapid annealing as set forth in claim 1, in which said high-pressure inert gas is selected from the group consisting of nitrogen and argon.

3. A method of rapid annealing as set forth in claim 1, in which said lamp unit radiates infrared rays.

4. A method of rapid annealing as set forth in claim 3, in which said semiconductor substrate is heated to a temperature ranging between 600 degrees in centigrade and 1000 degrees in centigrade.

5. A method of rapid annealing as set forth in claim 1, in which said multiple-layer structure is a plurality of field effect transistors.

6. A method of rapid annealing as set forth in claim 5, in which each of said field effect transistors comprises a gate structure having a polysilicon layer overlain by a refractory metal layer.

* * * * *

UNITED STATES PATENT AND TRADEMARK OFFICE
CERTIFICATE OF CORRECTION

PATENT NO. : 4,845,055

DATED : July 4, 1989

INVENTOR(S) : Takashi OGATA

It is certified that error appears in the above-identified patent and that said Letters Patent is hereby corrected as shown below:

Title page, item [22] should read:

--[22] Filed: May 17, 1988 --.

Signed and Sealed this

Seventeenth Day of April, 1990

Attest:

HARRY F. MANBECK, JR.

Attesting Officer

Commissioner of Patents and Trademarks